(12) United States Patent
Pan et al.

(10) Patent No.: US 7,894,172 B2
(45) Date of Patent: Feb. 22, 2011

(54) ESD PROTECTION STRUCTURE

(75) Inventors: Chi-Liang Pan, Keelung (TW);
Min-Lin Lee, Hsinchu (TW);
Shinn-Juh Lai, Hsinchu County (TW);
Shih-Hsien Wu, Taoyuan County (TW);
Chen-Hsuan Chiu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 134 days.

(21) Appl. No.: 12/191,179

(22) Filed: Aug. 13, 2008

(65) Prior Publication Data

US 2009/0180225 A1 Jul. 16, 2009

(30) Foreign Application Priority Data

Jan. 10, 2008 (TW) .............................. 97100969 A

(51) Int. Cl.
*H05F 3/00* (2006.01)
(52) U.S. Cl. ........................................ 361/56; 361/212
(58) Field of Classification Search .................. 361/56, 361/111, 212
See application file for complete search history.

(56) References Cited

U.S. PATENT DOCUMENTS

| | | | |
|---|---|---|---|
| 4,726,991 A | 2/1988 | Hyatt et al. |
| 5,029,041 A | 7/1991 | Robinson et al. |
| 5,889,308 A | 3/1999 | Hong et al. |
| 5,955,396 A | 9/1999 | Lee et al. |
| 5,955,762 A | 9/1999 | Hively |
| 5,970,321 A | 10/1999 | Hively |
| 5,974,661 A | 11/1999 | Neuhalfen |
| 6,023,028 A | 2/2000 | Neuhalfen |
| 6,108,184 A | 8/2000 | Minervini et al. |
| 6,191,928 B1 | 2/2001 | Rector et al. |
| 6,211,554 B1 | 4/2001 | Whitney |
| 6,351,011 B1 | 2/2002 | Whitney et al. |
| 6,431,456 B2 | 8/2002 | Nishizawa et al. |
| 6,549,114 B2 | 4/2003 | Whitney et al. |
| 6,573,567 B1 | 6/2003 | Nishizawa et al. |
| 6,628,498 B2 | 9/2003 | Whitney et al. |
| 6,693,508 B2 | 2/2004 | Whitney et al. |
| 6,721,157 B2 | 4/2004 | Shin |
| 6,935,879 B2 | 8/2005 | Whitney et al. |
| 7,034,652 B2 | 4/2006 | Whitney et al. |
| 7,075,404 B2 | 7/2006 | Hirose et al. |
| 7,102,196 B2 | 9/2006 | Lee |
| 7,132,922 B2 | 11/2006 | Harris et al. |
| 7,167,352 B2 | 1/2007 | Matsuoka et al. |
| 7,258,819 B2 | 8/2007 | Harris, IV |
| 7,688,598 B2 * | 3/2010 | Dudnikov et al. ........... 361/760 |

(Continued)

*Primary Examiner*—Danny Nguyen
(74) *Attorney, Agent, or Firm*—Tim Tingkang Xia; Morris, Manning & Martin, LLP

(57) ABSTRACT

An ESD protection structure is provided. A substrate includes a first voltage variable material and has a first surface, a second surface substantially paralleled to the first surface and a via connecting the first and second surfaces. A first metal layer is disposed in the substrate for coupling to a ground terminal. The first voltage variable material is in a conductive state when an ESD event occurs, such that the via is electrically connected with the first metal layer to form a discharge path, and the first voltage variable material is in an isolation state when the ESD event is absent, such that the via is electrically isolated from the first metal layer.

28 Claims, 14 Drawing Sheets

U.S. PATENT DOCUMENTS

2003/0071245 A1 4/2003 Harris, IV
2005/0275996 A1* 12/2005 Shin .......................... 361/212
2006/0152334 A1* 7/2006 Maercklein et al. ......... 338/210

* cited by examiner

ESD PROTECTION STRUCTURE

CROSS REFERENCE TO RELATED APPLICATIONS

This Application claims priority of Taiwan Patent Application No. 97100969, filed on Jan. 10, 2008, the entirety of which is incorporated by reference herein.

BACKGROUND OF THE INVENTION

1. Field of the Invention

The invention relates to an electrostatic discharge (ESD) protection structure, and more particularly to an ESD protection structure for carrying and coupling to the electrical devices or printed circuit board.

2. Description of the Related Art

If an electrostatic discharge (ESD) event occurs, an ESD protection structure must quickly transmit a large current (energy) generated by the ESD event to a ground terminal of electrical devices to avoid damage caused by the ESD event. In general, a maximum ESD threat voltage capability ($V_{ESD}$) of the ESD protection structure of electrical devices or systems is determined through an ESD testing experiment which conforms to a testing standard, wherein the maximum ESD threat voltage capability ($V_{ESD}$) corresponds to a maximum ESD treat voltage capability ($V_{ESD}$) supported by the ESD protection structure. In addition, the trigger voltage, clamping voltage, leakage current, parasitic loading effect (capacitance) generated by the protected signals or power loop and related parameters thereof will also determine the protection efficiency of the ESD protection structure.

Harris (U.S. Pat. No. 7,258,819) disclosed conductors, semiconductor particles or combinations thereof doped in a insulating materials (such as FR4 and FR5) of the printed circuit board (PCB) to form a voltage variable material (VVM) substrate, wherein the substrate with VVM can form different types of the ESD protection electrical devices through conventional PCB manufacturing technology. The VVM substrate is in a high impedance state (open circuit/isolation) during normal operation (the ESD event is absent), which functions as an ordinary insulator for carrying the electrical devices or increasing mechanical structural strength of the electrical device package. When an ESD event occurs, the large energy ESD signal will instantaneously activate/polarize the doping particles within the VVM substrate, such that the VVM substrate will be in a low impedance state (short circuit/conduction). Therefore, the low impedance state VVM substrate may transmit the ESD current to the common ground terminal of electrical devices or systems to obtain ESD protection requirement.

Whitney et al. (U.S. Pat. No. 6,351,011) discloses an ESD protection structure for an IC package substrate or semiconductor substrate. Whitney disclosed that a guard rail/ring is formed in a silicon wafer according to process steps (exposure, development and etching etc.), and a VVM is disposed between the guard ring and the I/O pad to enhance ESD protection efficiency of the IC package substrate or semiconductor substrate.

At present, more than one million transistors can be implemented in a single wafer/functional die due to advanced semiconductor process technology (90 nm, 65 nm, 45 nm . . . , etc.), and this enhances performance of the wafer/functional die. In addition, if IC packaging technology is continuously improved along with requirements and the IC package type continues to improve from the pin through hole technology (SIP, DIP etc.) to the surface mount technology (QFP, SOP, BGA, CSP etc.), the physical size of integrated circuit (chip) after packaging can be reduced. Therefore, more chips can be implemented in a single IC package, thus further enhancing electrical device performance. However, providing ESD protection for chips or systems within a limited IC package using the conventional ESD protection methods, is difficult. Specifically, it is difficult to satisfy requirements for higher ESD threat voltage capability ($V_{ESD}$) and lower parasitic loading effect (capacitance). Simultaneously, it is also difficult to apply ESD protection to chips or systems with higher I/O pins. Thus, an ESD protection structure for providing ESD protection function within chips/modules/systems without additional package size (structure) is desired.

BRIEF SUMMARY OF THE INVENTION

ESD protection structures are provided. An exemplary embodiment of such an ESD protection structure comprises a substrate comprising a first voltage variable material and having a first surface, a second surface substantially paralleled to the first surface and a via connecting the first and second surfaces; and a first metal layer disposed in the substrate for coupling to a ground terminal. The first voltage variable material is in a conductive state when an ESD event occurs, such that the via is electrically connected with the first metal layer to form a discharge path, and the first voltage variable material is in an isolation state when the ESD event is absent, such that the via is electrically isolated from the first metal layer.

Furthermore, an exemplary embodiment of a ESD protection structure comprises: a substrate having a first surface, a second surface substantially paralleled to the first surface and a via connecting the first and second surfaces; a first metal layer disposed in the substrate for coupling to a ground terminal; and a voltage variable material layer disposed in the substrate and adjacent to the via and the first metal layer, comprising a first voltage variable material. The voltage variable material layer is in a conductive state when an ESD event occurs, such that the via is electrically connected with the first metal layer to form a discharge path, and the voltage variable material layer is in an isolation state when the ESD is absent, such that the via is electrically isolated from the first metal layer A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
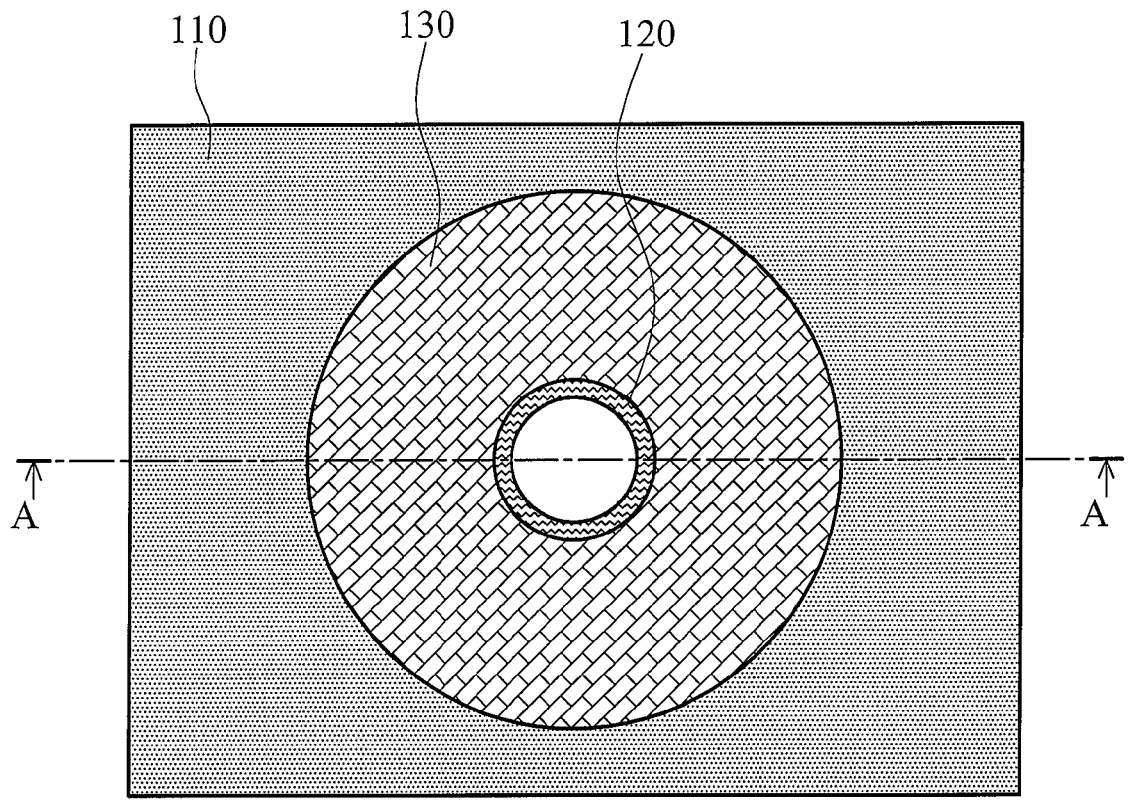
FIG. 1A shows a top view of an ESD protection structure according to an embodiment of the invention.
Figure 1B:
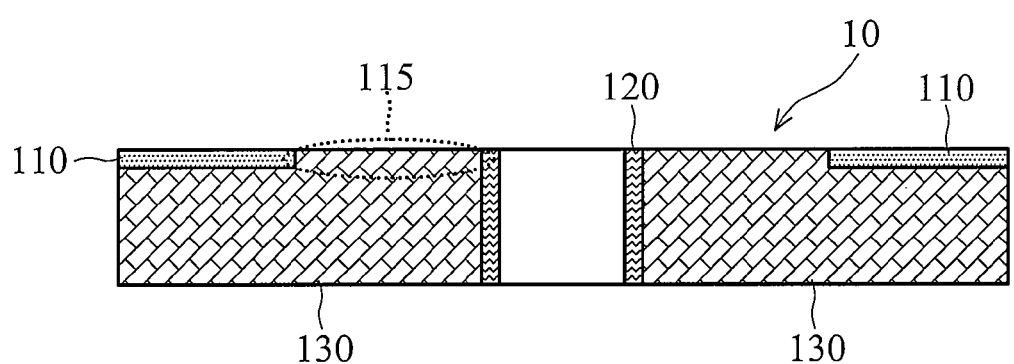
FIG. 1B shows a sectional view taken along a line A-A in FIG. 1A.

FIG. 1A shows a top view of an ESD protection structure according to an embodiment of the invention, and FIG. 1B shows a sectional view taken along a line A-A in FIG. 1A. A substrate 100A comprises a metal layer 110, a via 120 and a VVM layer 130, wherein a side wall of the via 120 is composed of conductive metal materials with conductive characteristics, such as copper, silver, tin and so on. The metal 110 is a ground layer (i.e. GND plane) and is disposed on a surface 10 of the substrate 100A. In addition, an equivalent spacing between the ground layer 110 and the via 120 is formed by process steps (etching, laser trimming, and so on.), such that an anti-ring 115 exists between the two electric conductors, thus avoiding the ground layer 110 from being directly connected to the via 120 to form a short circuit. The VVM layer 130 is adjacent to the via 120 and the ground layer 110. If an ESD event does not occur, the VVM layer 130 is in a high impedance state, i.e. an isolation state. Therefore, the VVM layer 130 is referred to as an insulation dielectric layer of an IC package or a PCB, which is used to carry the signal transmission lines and electrical devices and can provide a preferred mechanical structure carrying scheme.

However, if the ESD event does occur, the conducting particles doped in the VVM layer 130 are instantaneously activated/polarized to form an equivalent current conducting path due to an energy applied in the VVM layer 130. Therefore, allowing a large current generated by the ESD event to quickly flow from the via 120 to the ground layer 110 through the VVM layer 130 (i.e. the via 120 is electrically connected with the ground layer 110 to form a discharge path), such that the electrical devices (not shown) coupled to the via 120 can prevent damages caused by ESD event. Thus, the VVM layer 130 is in a conductive state when an ESD event occurs, such that the via 120 and the ground layer 110 are electrically connected, and the VVM layer 130 is in an isolation state when the ESD event is absent (i.e. the ESD event isn't occurred), such that the via 120 and the ground layer 110 are electrically isolated. Moreover, compared to the length (or longitudinal height) of the via 120, the ground layer 110 has a thinner/flatter conductor thickness (such as longitudinal height of the copper foil). Therefore, an equivalent point discharge structure is formed between the ground layer 110 and the via 120, such that this embodiment has ESD protection efficiency. In addition, by controlling the conductor thickness of the ground layer 110 through process steps (ex. electroless plating, electroplating, electrolytic deposition, and so on.) or by controlling a spacing (etching, laser trimming, and son on.) between the ground layer 110 and the via 120, the ESD protection efficiency of the entire ESD protection structure can be equivalently controlled.

Figure 1C:
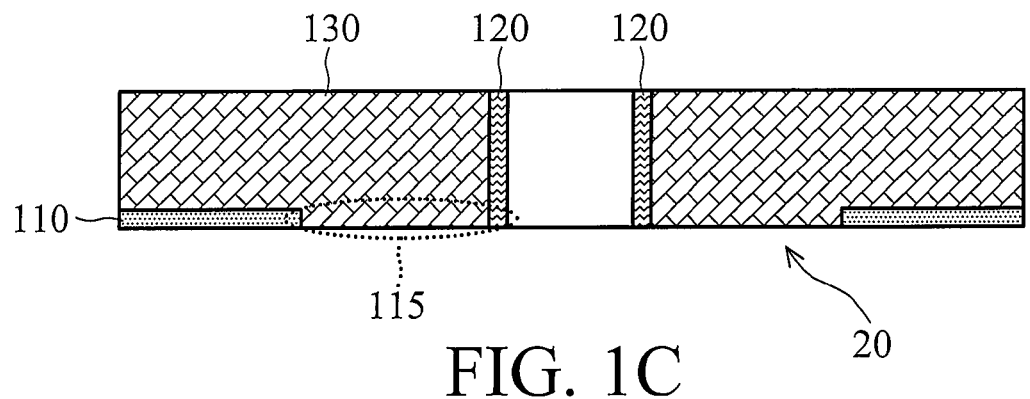
FIGS. 1C and 1D show the sectional views of the ESD protection structure according to another embodiment of the invention, respectively.
Figure 1D:
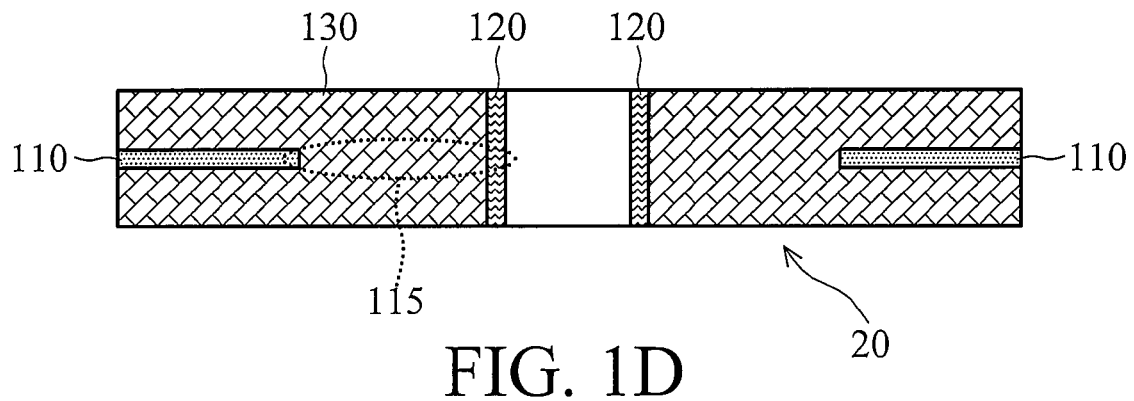

FIGS. 1C and 1D show the sectional views of the ESD protection structure according to another embodiment of the invention, respectively. In FIG. 1C, the ground layer 110 is disposed on a surface 20 of a substrate 100B. In FIG. 1D, the ground layer 110 is disposed within a substrate 100C and is surrounded by the VVM layer 130.

Figure 2:
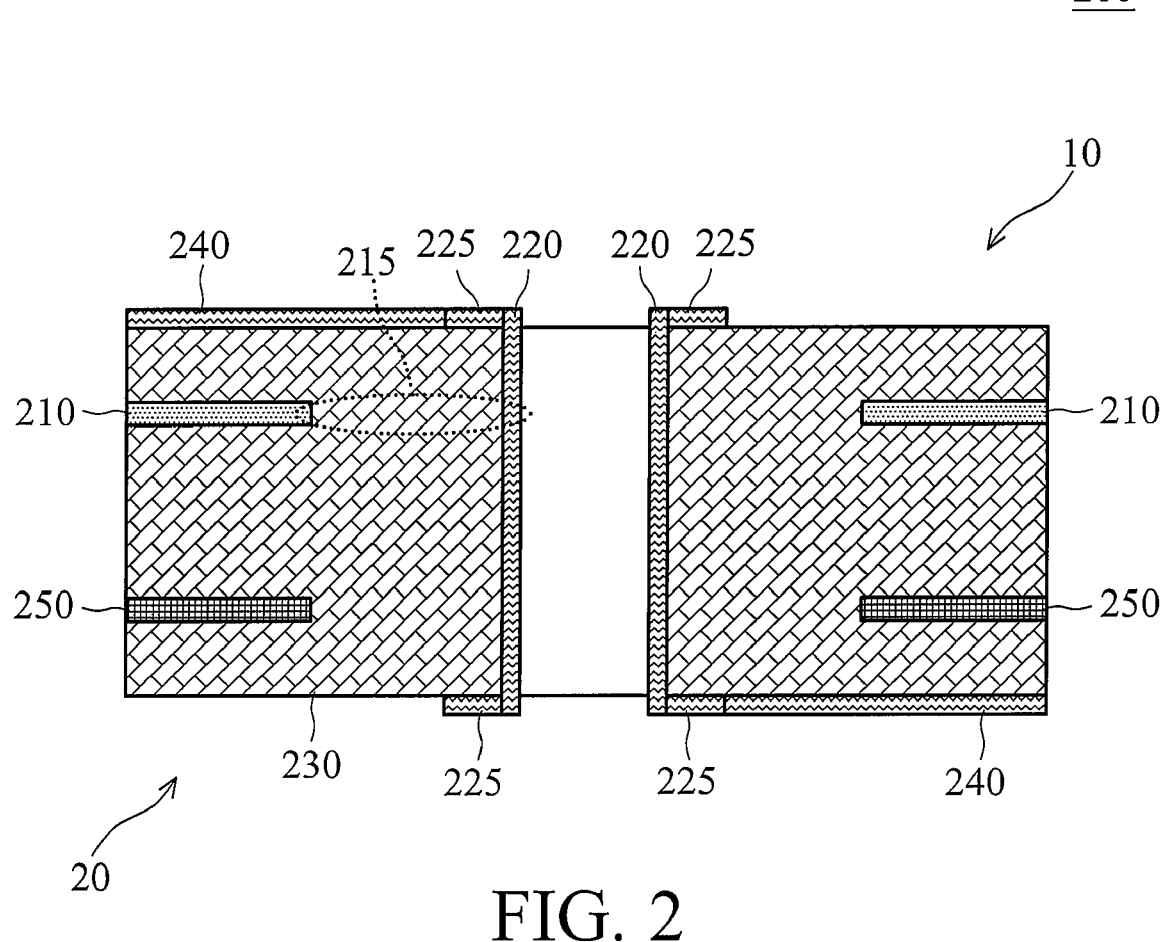
FIG. 2 shows a sectional view of an ESD protection structure according to another embodiment of the invention.

FIG. 2 shows a sectional view of an ESD protection structure according to another embodiment of the invention. In this embodiment, a substrate 200 is an IC package substrate or a PCB. The substrate 200 comprises a ground layer 210, a via 220, a VVM layer 230 and three metal layers 225, 240 and 250, wherein an anti-ring 215 is formed between the ground layer 210 and the via 220. The metal layer 225 is a ring and is disposed on the surfaces 10 and 20 and located on the outside of the via 220. The metal layer 240 is a signal layer, which is signal transmission path for transmitting signals and can be disposed in any layer of the IC package substrate or PCB (inner or outer layer). The signal (analog- or digital-signal) or power (supply voltages) transmitted in the signal layer is transmitted to the via 220 through the signal layer 240 and the ring 225 disposed on the surface 10, and then the signal (analog- or digital-signal) or power (supply voltages) is transmitted to the signal layer 240 and the ring 225 disposed on the surface 20 from the via 220. Furthermore, the metal layer 250 is a power layer, wherein the power layer 250 is coupled to the supply power of a chip or system within the IC package substrate or PCB.

If the ESD event occurs on the surface 10 of the substrate 200, an ESD current generated by the ESD event will sequentially flow from the signal layer 240 disposed on the surface 10 to the ground layer 210 through the ring 225 disposed on the surface 10, the via 220 and the VVM layer 230, such that the electrical devices (not shown) coupled to the via 220 will be prevented from ESD damage. Alternatively, if the ESD event occurs on the surface 20 of the substrate 200, the ESD current will sequentially flow from the signal layer 240 disposed on the surface 20 to the ground layer 210 through the ring 225 disposed on the surface 20, the via 220 and the VVM layer 230, such that the electrical devices (not shown) coupled to the via 220 will be prevented from ESD damage.

As known in the art, the ring 225 may be disposed in the inner layer or outer layer of the substrate. Therefore, a signal or power can transmit electrical signals (analog/digital signals or supply voltages) thereof to any layer of the substrate, or a signal or power can be transmitted to more than one layer of the substrate. Moreover, in the embodiment of the invention, according to the property of the signal coupled between the via and the chip or between the via and the PCB, the via can separately transmit three electrical signals as follows: a) analog and digital signals, wherein the via is referred to as a signal via, for example, if via 220 is a signal via in FIG. 2, the signal via 220, the ground layer 210 and the power layer 250 are in an isolation state; b) power signals, wherein the via is referred to as a PWR via, for example, if the via 220 is a PWR via in FIG. 2, the PWR via 220 is electrically connected with the power layer 250 through other manners (not shown), and the PWR via 220, the ground layer 210 and other signal layers/leads are in an isolation state; and c) ground signals, wherein the via is referred to as a GND via, for example, if the via 220 is a GND via in FIG. 2, the GND via 220 is electrically connected with the ground layer 210 through other manners (not shown), and the GND via 220, the power layer 250 and other signal layers/leads are in an isolation state. In addition, power may comprise positive power, negative power and ground signal as known in the art, thus isolation in response to the connection thereof is necessary.

Figure 3A:
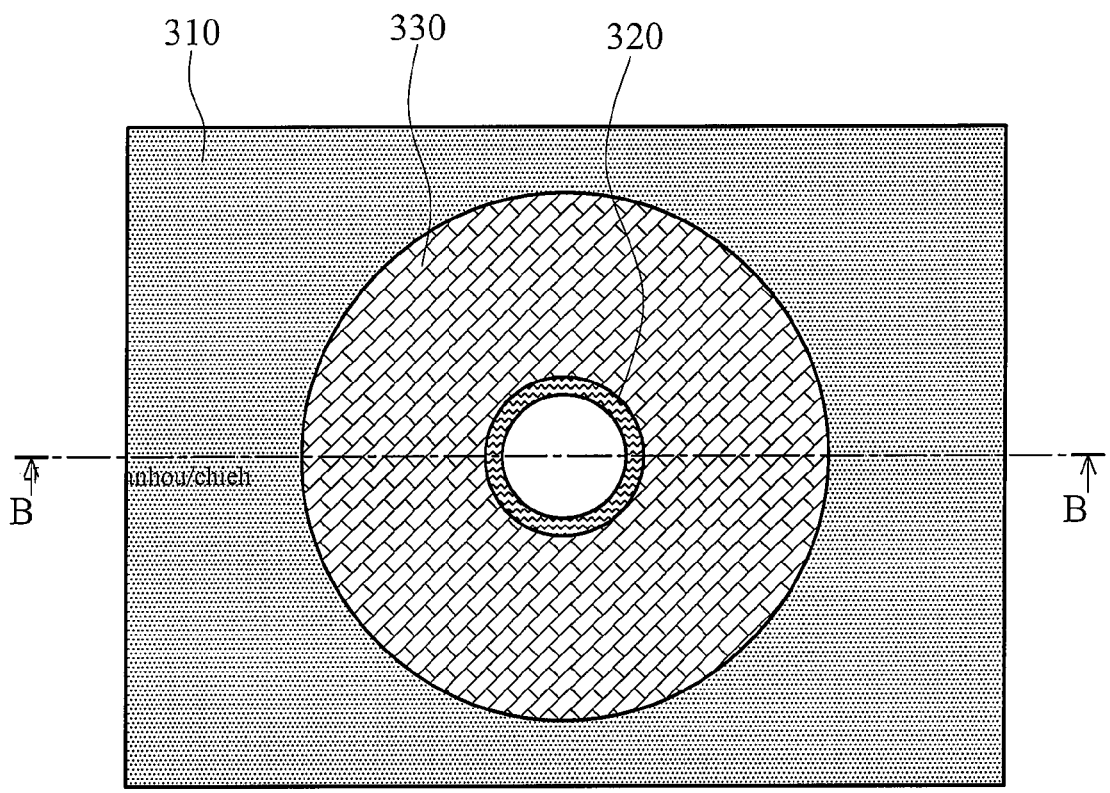
FIG. 3A shows a top view of an ESD protection structure according to another embodiment of the invention.
Figure 3B:
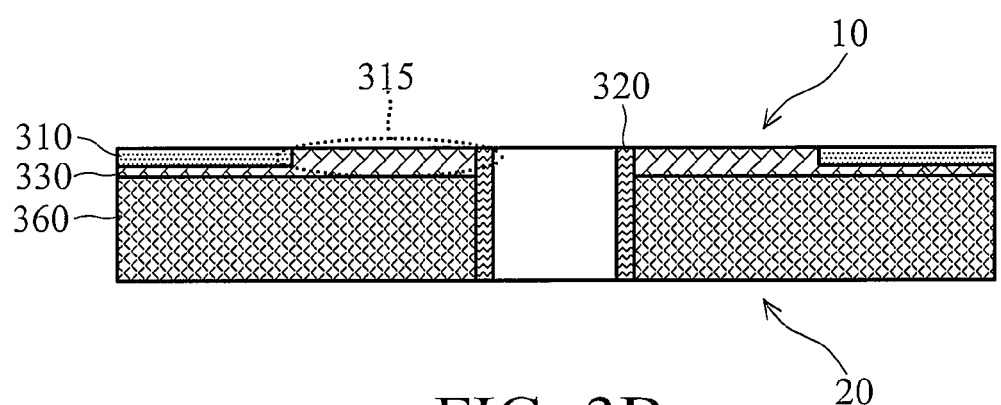
FIG. 3B shows a sectional view taken along a line B-B in FIG. 3A.

FIG. 3A shows a top view of an ESD protection structure according to another embodiment of the invention, and FIG. 3B shows a sectional view taken along a line B-B in FIG. 3A. A substrate 300A comprises a ground layer 310, a via 320, a VVM layer 330 and an isolation layer 360, wherein an anti-ring 315 is formed between the ground layer 310 and the via 320. The ground layer 310 is disposed on a surface 10 of the substrate 300A. As shown in FIG. 3B, the VVM layer 330 is adjacent to the surface 10 of the substrate 300A, and the isolation layer 360 is adjacent to a surface 20 of the substrate 300A. Furthermore, the substrate 300A is substantially composed of material which is similar to that of the isolation layer 360. In the embodiment of the invention, a relation between the VVM layer 330 and the isolation layer 360 (ex. the disposed location or ratio) can be controlled to achieve protection efficiency electrical targets of the ESD protection structure, such as the trigger voltage, clamping voltage, leakage current, maximum ESD threat voltage capability ($V_{ESD}$) and parasitic loading effect (capacitance). In addition, in this embodiment, the isolation layer 360 and the VVM layer 330 have different dielectric constants, wherein the isolation layer 360 is composed of the insulating materials without VVM characteristics, such as Roger, FR4, FR5 and so on, and the isolation layer 360 may be formed by choosing from one of the single insulating materials or multiple complex laminated/aligned insulating materials. Furthermore, when an ESD event occurs, a large current generated by the ESD event will flow from the via 320 to the ground layer 310 through the VVM layer 330. In another embodiment, the isolation layer 360 is composed of the VVM with VVM characteristics, wherein the VVM of the isolation layer 360 and the VVM layer 330 have different dielectric constants, and the isolation layer 360 may be formed by choosing from one of the single VVM or multiple complex laminated/aligned VVMs.

Figure 3C:
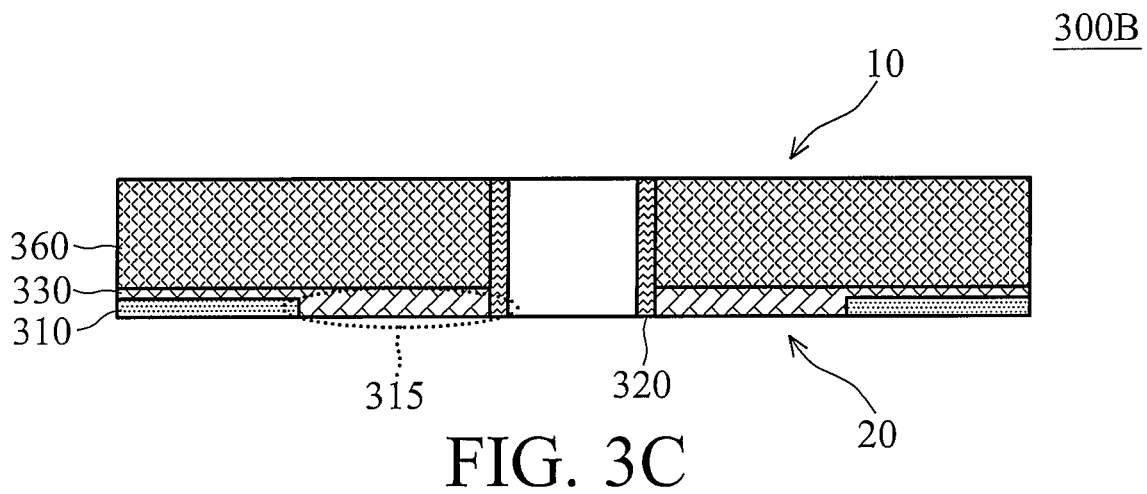
FIGS. 3C, 3D and 3E show the sectional views of the ESD protection structure according to another embodiment of the invention, respectively.
Figure 3D:
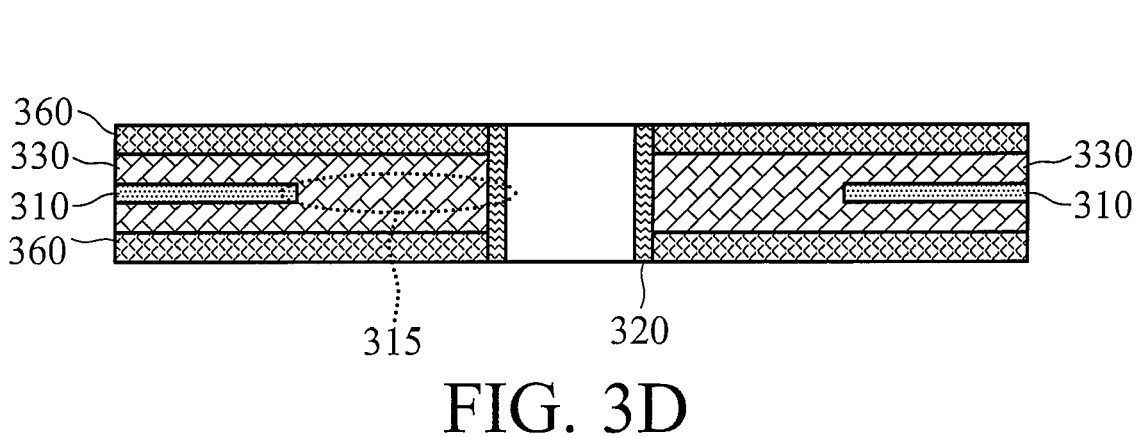
Figure 3E:
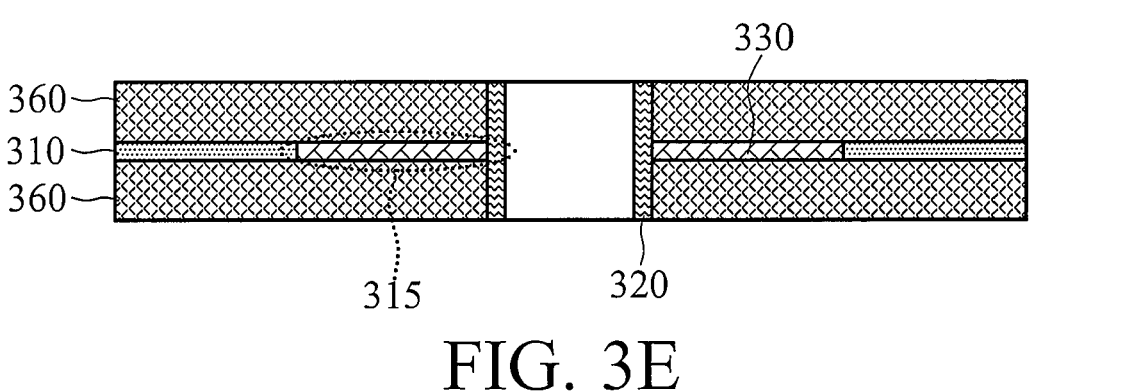

FIGS. 3C, 3D and 3E show the sectional views of the ESD protection structure according to another embodiment of the invention, respectively. In FIG. 3C, the ground layer 310 is disposed on the surface 20 of a substrate 300B, wherein the VVM layer 330 is adjacent to the surface 20 of the substrate 300B and the isolation layer 360 is adjacent to the surface 10 of the substrate 300B. In FIG. 3D, the ground layer 310 is disposed within a substrate 300C and is surrounded by the VVM layer 330. Moreover, the VVM layer 330 is surrounded by the isolation layer 360. In FIG. 3E, the ground layer 310 is disposed within a substrate 300D and is surrounded by the isolation layer 360. The VVM layer 330 is disposed between the ground layer 310 and the via 320, and has substantially the same thickness as the ground layer 310. In the embodiment of FIGS. 3C-3E, the isolation layer 360 is composed of the VVM with VVM characteristics, wherein the isolation layer 360 and the VVM layer 330 have different dielectric constants, and the isolation layer 360 may be formed by choosing from one of the single VVM or multiple complex laminated/aligned VVMs. In the related embodiments above, some process steps such as stencil printing, screen printing, sputtering dielectric material, laminating and so on are used to complete the partial or entire disposition of the isolation layer or the VVM layer.

Figure 4:
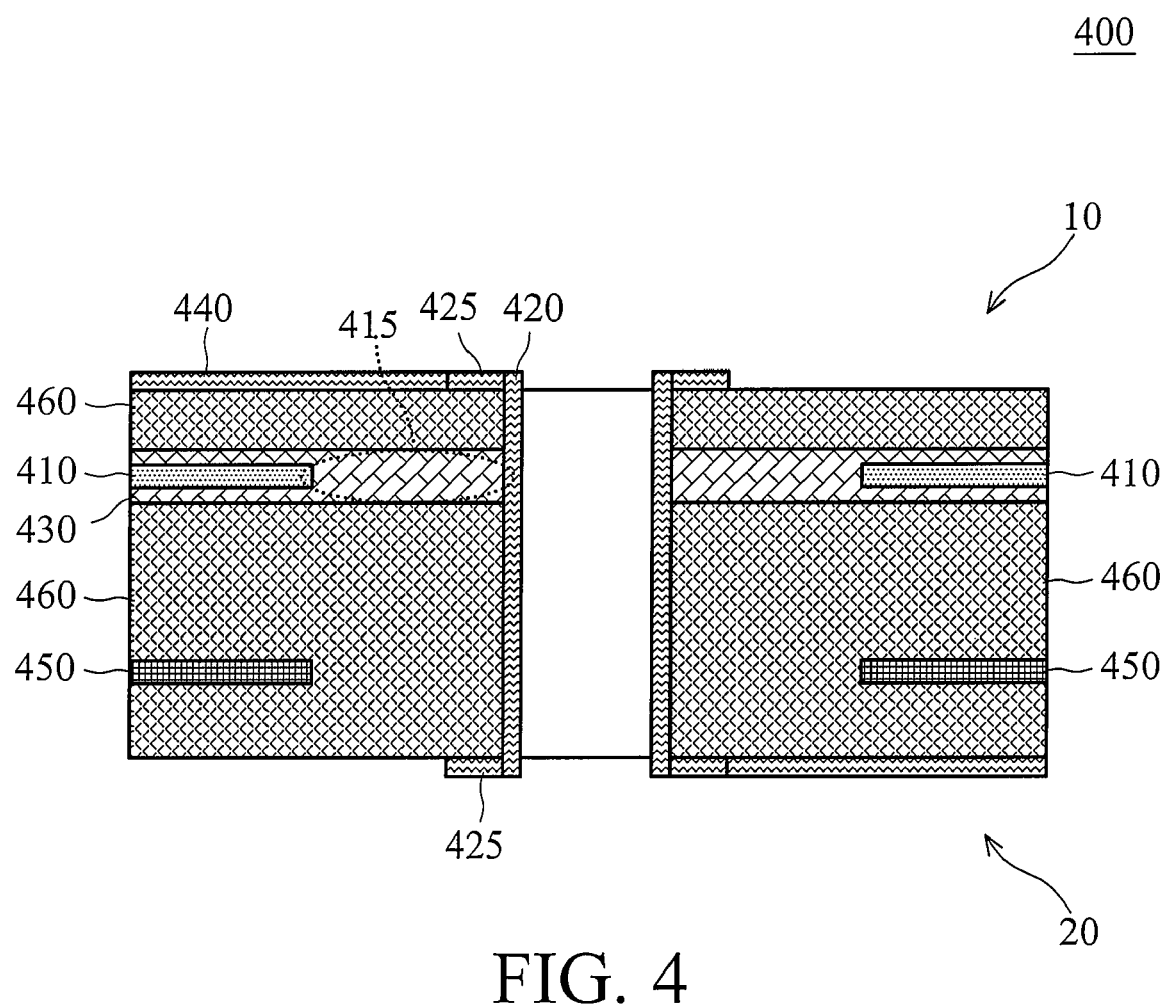
FIG. 4 shows a sectional view of an ESD protection structure according to another embodiment of the invention.

FIG. 4 shows a sectional view of an ESD protection structure according to another embodiment of the invention. In this embodiment, a substrate 400 is an IC package substrate or a PCB. The substrate 400 comprises a ground layer 410, a via 420, a ring 425, a VVM layer 430, a signal layer 440, a power layer 450 and an isolation layer 460, wherein an anti-ring 415 is formed between the ground layer 410 and the via 420. If an ESD event occurs on the surface 10 of the substrate 400, an ESD current generated by the ESD event sequentially flows from the signal layer 440 disposed on the surface 10 to the ground layer 410 through the ring 425 disposed on the surface 10, the via 420 and the VVM layer 430, such that the electrical devices (not shown) coupled to the via 420 are prevented from ESD damage. Alternatively, if the ESD event occurs on the surface 20 of the substrate 400, the ESD current flows from the signal layer 440 disposed on the surface 20 to the ground layer 410 through the ring 425 disposed on the surface 20, the via 420 and the VVM layer 430 in sequence, such that the electrical devices (not shown) coupled to the via 420 are prevented from ESD damage. In another embodiment, the isolation layer 460 is composed of the VVM, which is not insulating materials without VVM characteristics, wherein the VVM of the isolation layer 460 and the VVM layer 430 have different dielectric constants. In another embodiment, the isolation layer 460 is composed of the VVM with VVM characteristics, wherein the VVM of the isolation layer 460 and the VVM layer 430 have different dielectric constants, and the isolation layer 460 may be formed by choosing from one of the single VVM or multiple complex laminated/aligned VVMs.

Figure 5A:
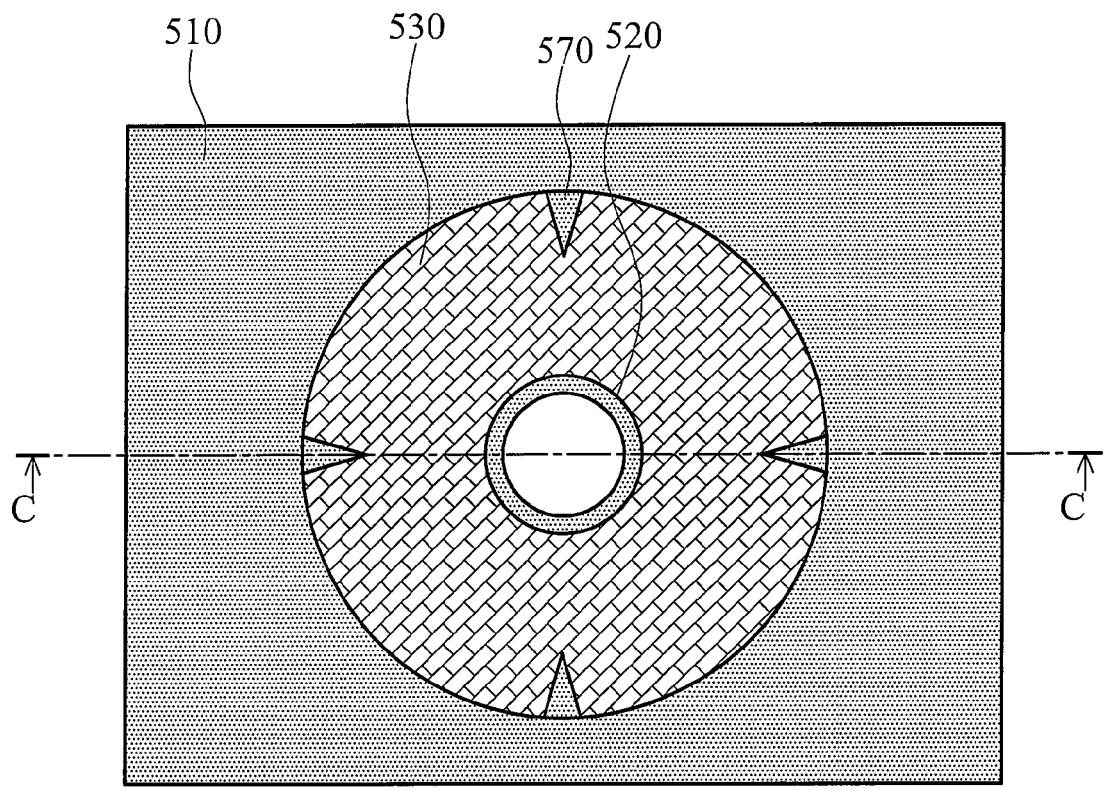
FIG. 5A shows a top view of an ESD protection structure according to another embodiment of the invention.
Figure 5B:
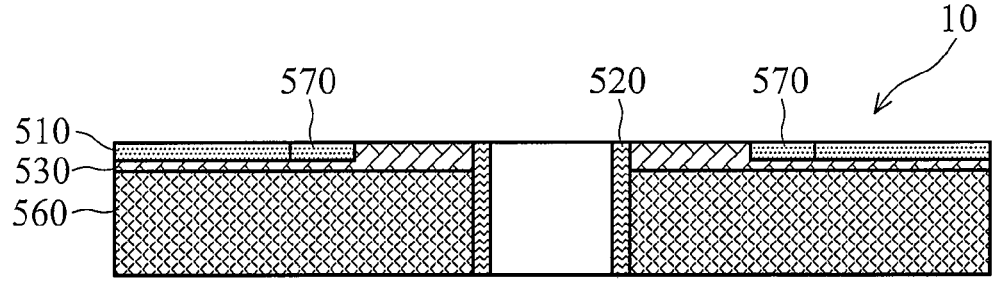
FIG. 5B shows a sectional view taken along a line C-C in FIG. 5A.

FIG. 5A shows a top view of an ESD protection structure according to another embodiment of the invention, and FIG. 5B shows a sectional view taken along a line C-C in FIG. 5A. A substrate 500 comprises a ground layer 510, a via 520, a VVM layer 530, an isolation layer 560 and a metal layer 570, wherein the metal layer 570 and the ground layer 510 have substantially the same electrical characteristics. The ground layer 510 is disposed on the surface 10 of the substrate 500. The metal layer 570 is adjacent to and electrically connected with the ground layer 510, thus the metal layer 570 is also coupled to the ground terminal. In an embodiment, the metal layer 570 is an extended portion of the ground layer 510. As shown in FIG. 5A, the metal layer 570 has a point part, which is pointed to the via 520. In this embodiment, the amount and relative positions of the metal layer 570 are an example of the invention and not limited to the scope of the invention. In addition, the metal layer 570 can be designed to any type of configuration or pattern for accumulating electric charges. Moreover, the metal layer 570 is completed by the process steps, which are the same as the ground layer 510, without adding additional process steps during the manufacturing process of the substrate 500. Referring to FIG. 5B, the VVM layer 530 is adjacent to the surface 10 of the substrate 500, and the isolation layer 560 is adjacent to the surface 20 of the substrate 500 (not shown). Furthermore, if an ESD event occurs, a large current generated by the ESD event sequentially flows from the via 520 to the ground layer 510 through the VVM layer 530 and the metal layer 570. According to point discharge theorem, a polarization time of the VVM layer 530 during the ESD event can be decreased by appropriately controlling the size and pattern of the metal layer 570 and adjusting a spacing between the point part of the metal layer 570 and the via 520 to obtain the preferred ESD protection efficiency (the lower trigger and clamping voltages). As described above, each layer of the substrate 500 also has other different disposed modes. Moreover, in another embodiment, the isolation layer 560 is composed of the VVM with VVM characteristics, wherein the VVM of the isolation layer 560 and the VVM layer 530 have different dielectric constants, and the isolation layer 560 may be formed by choosing from one of the single VVM or multiple complex laminated/aligned VVMs. In addition, in another embodiment, the isolation layer 560 and the VVM layer 530 are composed of the same VVMs.

Figure 6A:
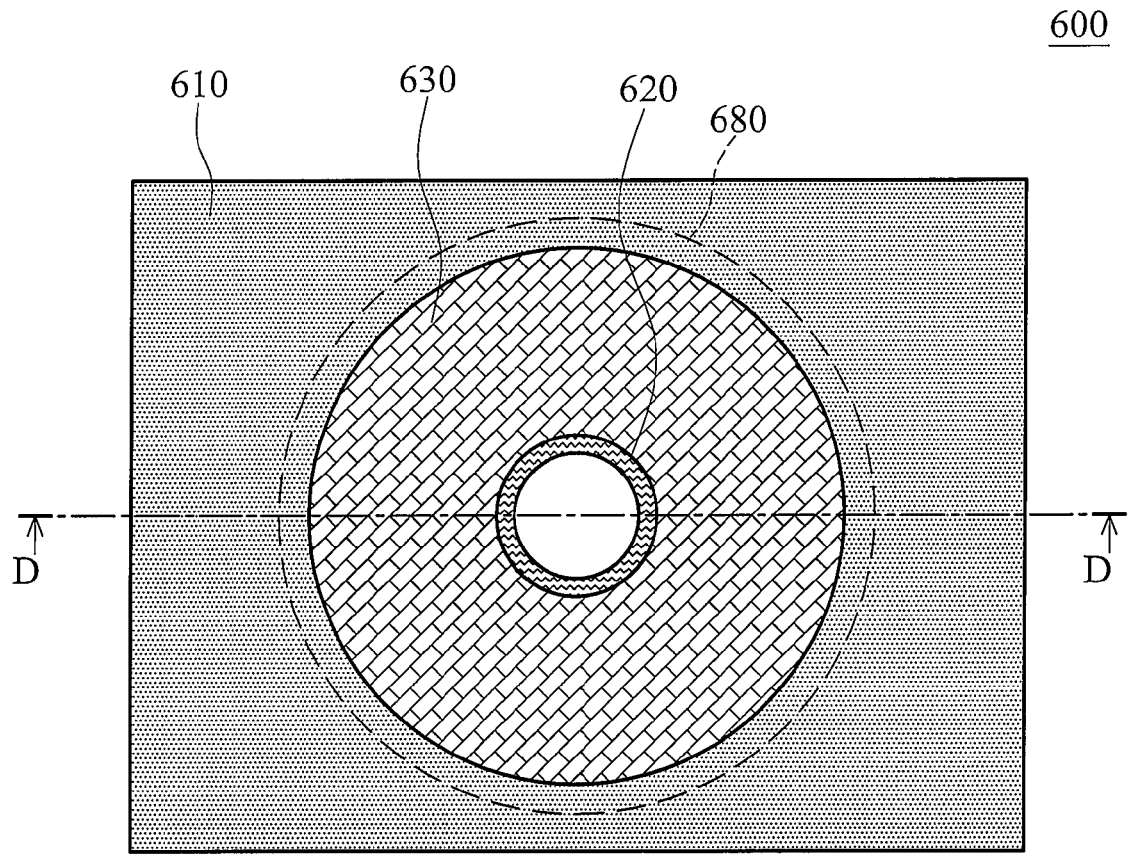
FIG. 6A shows a top view of an ESD protection structure according to another embodiment of the invention.
Figure 6B:
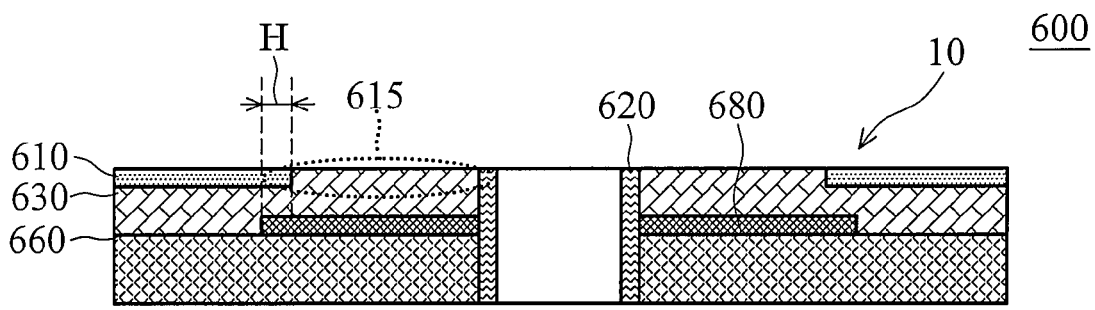
FIG. 6B shows a sectional view taken along a line D-D in FIG. 6A.

FIG. 6A shows a top view of an ESD protection structure according to another embodiment of the invention, and FIG. 6B shows a sectional view taken along a line D-D in FIG. 6A. A substrate 600 comprises a ground layer 610, a via 620, a VVM layer 630, an isolation layer 660 and a metal layer 680, wherein an anti-ring 615 is formed between the ground layer 610 and the via 620. As shown in FIG. 6B, the metal layer 680 and the ground layer 610 have an overlap part H in a projection direction, and the metal layer 680 is adjacent to and electrically connected with the via 620. Furthermore, the metal layer 680 and the via 620 have substantially the same electrical characteristics. The VVM layer 630 is adjacent to a surface 10 of the substrate 600 and is disposed between the ground layer 610 and the metal layer 680. If an ESD event occurs, a large current generated by the ESD event will flow to the ground terminal through a conductive path between the via 620, the metal layer 680, the VVM layer 630 and the ground layer 610. During the ESD event, an equivalent impedance of the overlap part H within the VVM layer 630 is controlled by adjusting the thickness of the VVM layer 630 (i.e. a spacing between the ground layer 610 and the metal layer 680), thus a maximum ESD threat voltage capability ($V_{ESD}$) of the ESD protection structure can be adjusted in response to the equivalent impedance. Moreover, a maximum parasitic loading effect (capacitance) rating of the electrical device corresponding to different operating signals can also be designed or adjusted the thickness of the VVM layer 630. As described above, each layer of the substrate 600 also has other different disposed modes. Moreover, in another embodiment, the isolation layer 660 is composed of the VVM with VVM characteristics, wherein the VVM of the isolation layer 660 and the VVM layer 630 have different dielectric constants, and the isolation layer 660 may be formed by choosing from one of the single VVM or multiple complex laminated/aligned VVMs. In addition, in another embodiment, the isolation layer 660 and the VVM layer 630 are composed of the same VVMs.

Figure 7A:
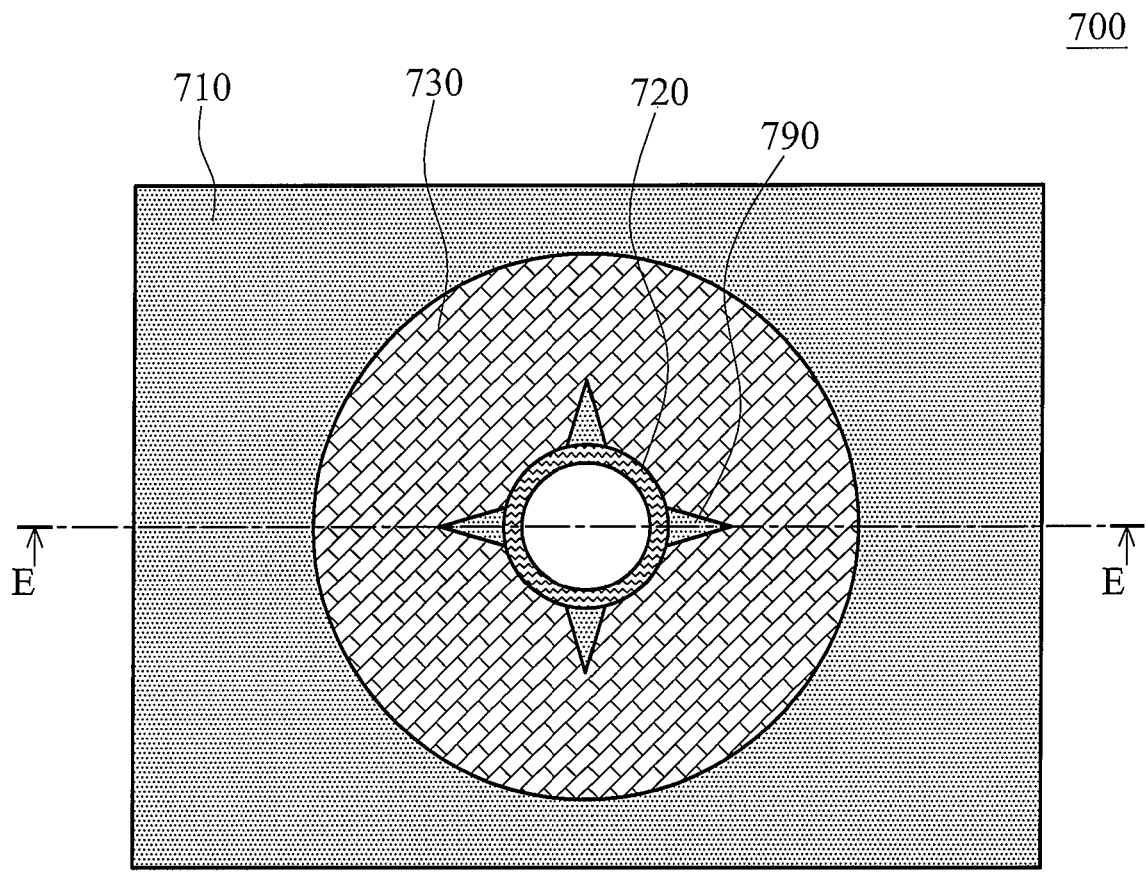
FIG. 7A shows a top view of an ESD protection structure according to another embodiment of the invention.
Figure 7B:
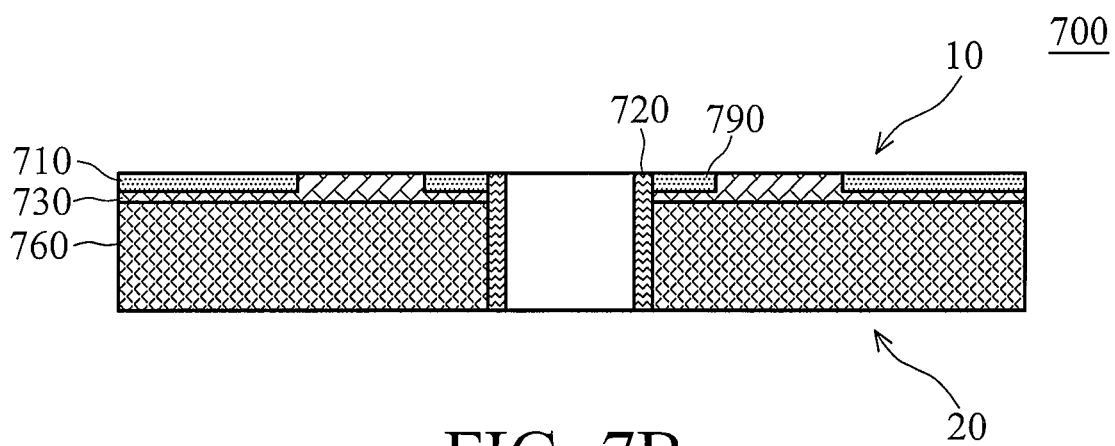
FIG. 7B shows a sectional view taken along a line E-E in FIG. 7A.

FIG. 7A shows a top view of an ESD protection structure according to another embodiment of the invention, and FIG. 7B shows a sectional view taken along a line E-E in FIG. 7A. A substrate 700 comprises a ground layer 710, a via 720, a VVM layer 730, an isolation layer 760 and a metal layer 790, wherein the metal layer 790 and the via 720 have substantially the same electrical characteristics. The metal layer 790 is adjacent to and electrically connected with the via 720. As shown in FIG. 7A, the metal layer 790 has a point part, which is pointed to the ground layer 710. In this embodiment, the amount and relative positions of the metal layer 790 shown in FIG. 7A are an example of the invention and not limited to the scope of the invention. In addition, the metal layer 790 can be designed to any type of configuration or pattern for accumulating electric charges. As shown in FIG. 7B, the VVM layer 730 is adjacent to a surface 10 of the substrate 700, and the isolation layer 760 is adjacent to a surface 20 of the substrate 700. If an ESD event occurs, a current generated by the ESD event will flow to the ground terminal through a conductive path between the via 720, the metal layer 790, the VVM layer 730 and the ground layer 710. According to point discharge theorem, a polarization time of the VVM layer 730 during the ESD event can be decreased by appropriately controlling the size and pattern of the metal layer 790 and adjusting a spacing between the point part of the metal layer 790 and the ground layer 710 to obtain lower trigger and clamping voltages. As described above, each layer of the substrate 700 also has other different disposed modes. Therefore, the specific terminals within the point discharge structure further has the efficiency of accumulating electric charges by appropriately using the point discharge structure within the ESD protection structure, and thus enhancing the protection efficiency of the ESD protection structure. Moreover, in another embodiment, the isolation layer 760 is composed of the VVM with VVM characteristics, wherein the VVM of the isolation layer 760 and the VVM layer 730 have different dielectric constants, and the isolation layer 760 may be formed by choosing from one of the single VVM or multiple complex laminated/aligned VVMs. In addition, in another embodiment, the isolation layer 760 and the VVM layer 730 are composed of the same VVMs.

Figure 8A:
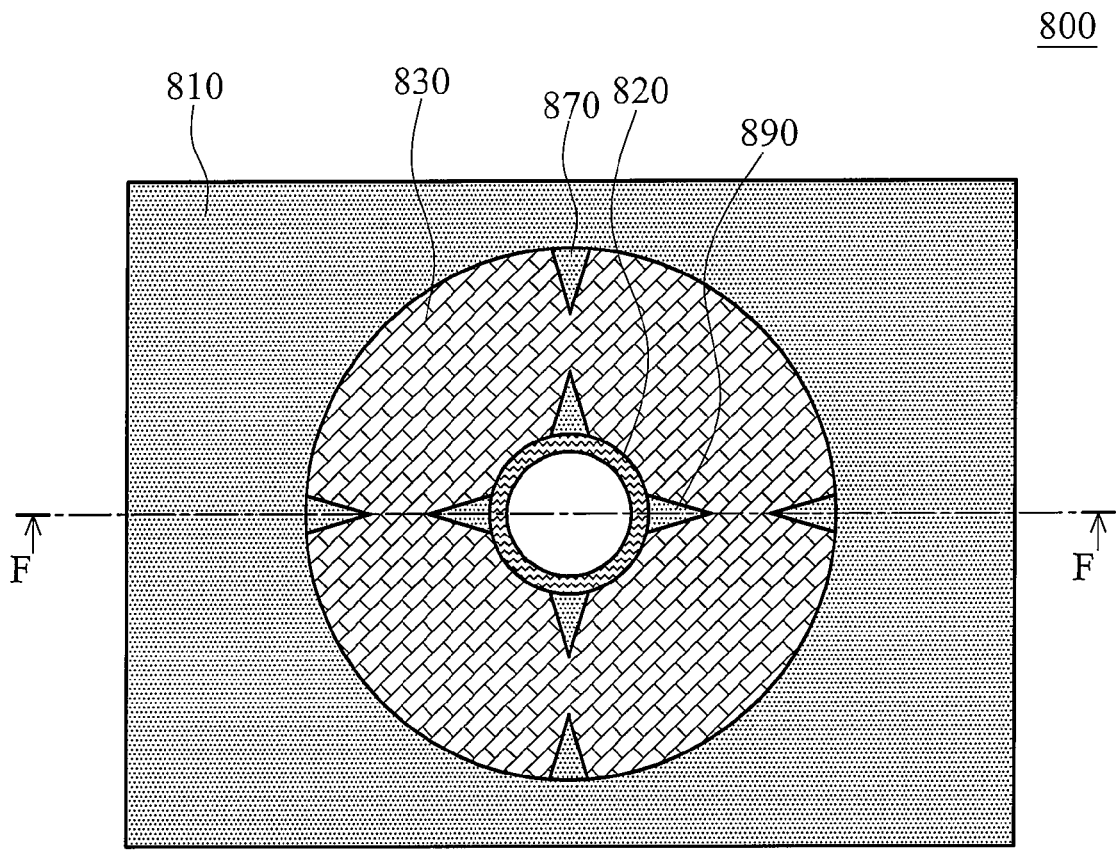
FIG. 8A shows a top view of an ESD protection structure according to another embodiment of the invention.
Figure 8B:
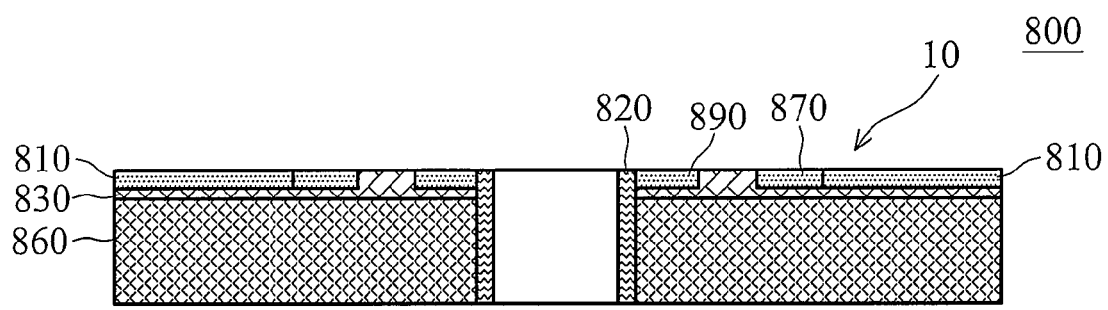
FIG. 8B shows a sectional view taken along a line F-F in FIG. 8A.

FIG. 8A shows a top view of an ESD protection structure according to another embodiment of the invention, and FIG. 8B shows a sectional view taken along a line F-F in FIG. 8A. A substrate 800 comprises a ground layer 810, a via 820, a VVM layer 830, an isolation layer 860 and two metal layers 870 and 890. As described above, the metal layer 870 and the ground layer 810 have substantially the same electrical characteristics, and the metal layer 890 and the via 820 have substantially the same electrical characteristics. In this embodiment, the amount of the metal layer 870 and the metal layer 890 and relative positions of each other are an example of the invention and not limited to the scope of the invention. In addition, the metal layers 870 and 890 can be designed to any type of configuration or pattern for accumulating electric charges. Furthermore, if an ESD event occurs, a large current generated by the ESD event will flow to the ground terminal through a conductive path between the via 820, the metal layer 890, the VVM layer 830, the metal layer 870 and the ground layer 810. As described above, each layer of the substrate 800 also has other different disposed modes. Moreover, in another embodiment, the isolation layer 860 is composed of the VVM with VVM characteristics, wherein the VVM of the isolation layer 860 and the VVM layer 830 have different dielectric constants, and the isolation layer 860 may be formed by choosing from one of the single VVM or multiple complex laminated/aligned VVMs. In addition, in another embodiment, the isolation layer 860 and the VVM layer 830 are composed of the same VVMs.

Figure 9A:
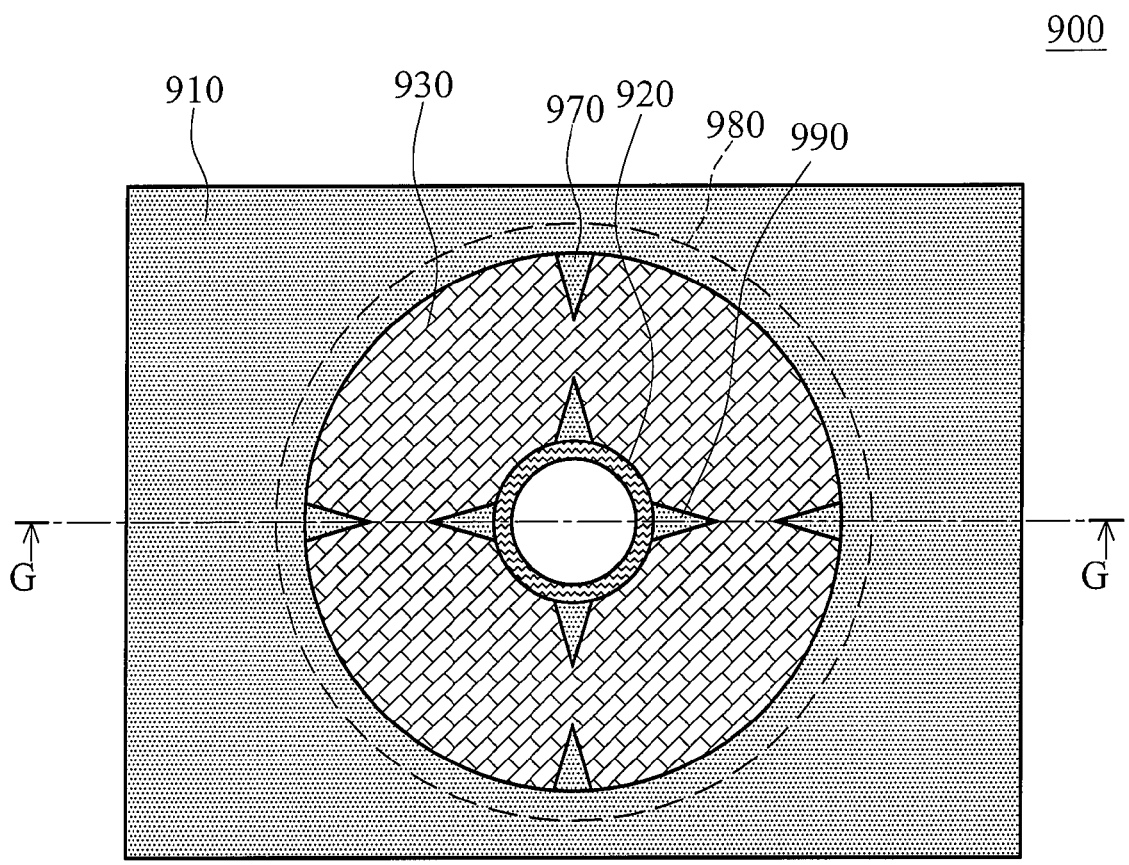
FIG. 9A shows a top view of an ESD protection structure according to another embodiment of the invention.
Figure 9B:
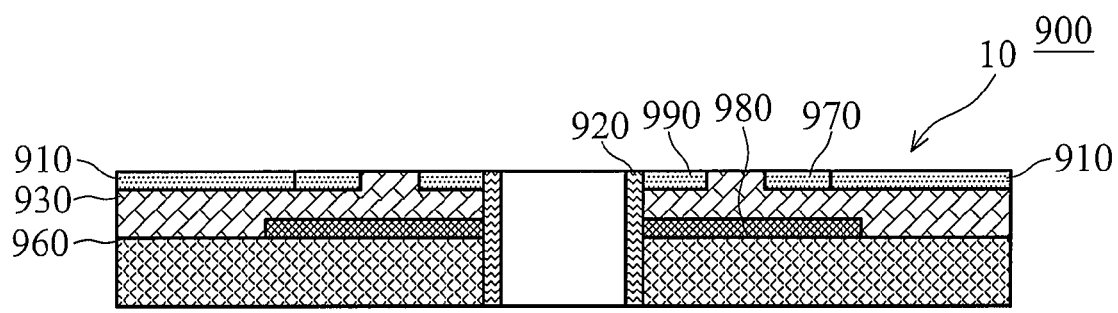
FIG. 9B shows a sectional view taken along a line G-G in FIG. 9A.

FIG. 9A shows a top view of an ESD protection structure according to another embodiment of the invention, and FIG. 9B shows a sectional view taken along a line G-G in FIG. 9A. A substrate 900 comprises a ground layer 910, a via 920, a VVM layer 930, an isolation layer 960 and three metal layers 970, 980 and 990. Furthermore, if an ESD event occurs, a large current generated by the ESD event will flow to the ground terminal through a conductive path between the via 920, the metal layer 990, the VVM layer 930, the metal layer 980, the metal layer 970 and the ground layer 910. As described above, each layer of the substrate 900 also has other different disposed modes. Moreover, in another embodiment, the isolation layer 960 is composed of the VVM with VVM characteristics, wherein the VVM of the isolation layer 960 and the VVM layer 930 have different dielectric constants, and the isolation layer 960 may be formed by choosing from one of the single VVM or multiple complex laminated/aligned VVMs. In addition, in another embodiment, the isolation layer 960 and the VVM layer 930 are composed of the same VVMs.

Figure 10:
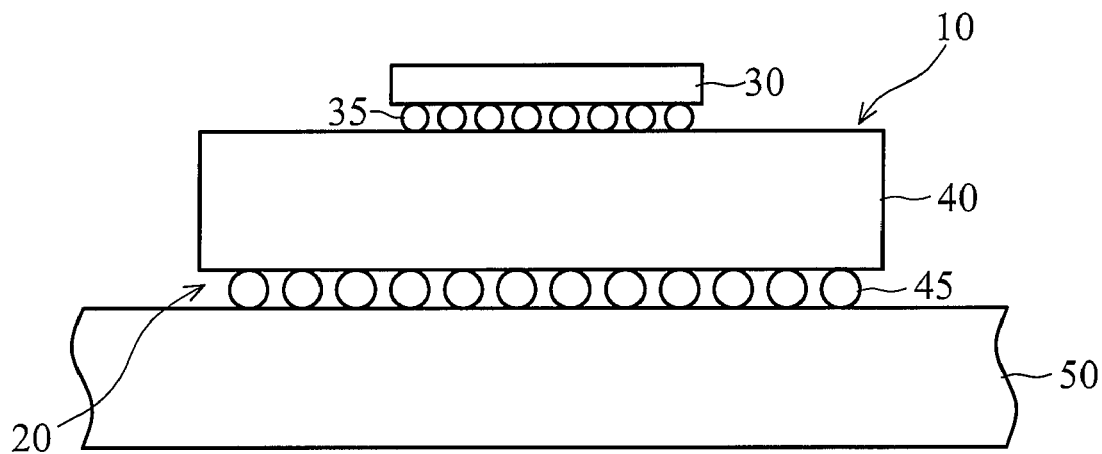
FIG. 10 shows an application schematic diagram of an ESD protection structure according to an embodiment of the invention.

FIG. 10 shows an application schematic diagram of an ESD protection structure according to an embodiment of the invention. In this embodiment, a substrate 40 is an IC package substrate for carrying functional die 30. In FIG. 10, the functional die 30 is coupled to the vias of the substrate 40 through a plurality of connecting points 35 disposed on a surface 10. A PCB 50 is coupled to the vias of the substrate 40 through a plurality of connecting points 45 disposed on a surface 20. Thus, the substrate 40 is electrically connected to a plurality of pads within the functional die 30 through the connecting points 35, and is electrically connected to the vias within the PCB 50 through the connecting points 45. As known in the art, the bonding between a die and a substrate (such as a IC package substrate or an interposer) are implemented through package bonding techniques such as solder bumps/pads bonding or wire bonding. As described above, the ESD protection structures described in the embodiments of the invention can be implemented in the PCB 50. Moreover, according to the ESD protection structures described in the invention, for ESD event occurrence, the energy generated from the ESD event will be applied to the ESD protection structures of the substrate or PCB with a scaled or un-scaled manner respectively, by adjusting some specific configurations of the substrate or PCB (such as VVM thickness, VVM layer number, electrical configuration size etc.) to share the energy collectively, thus enhancing the ESD protection capability of electrical devices or systems ($V_{ESD}$).

Figure 11:
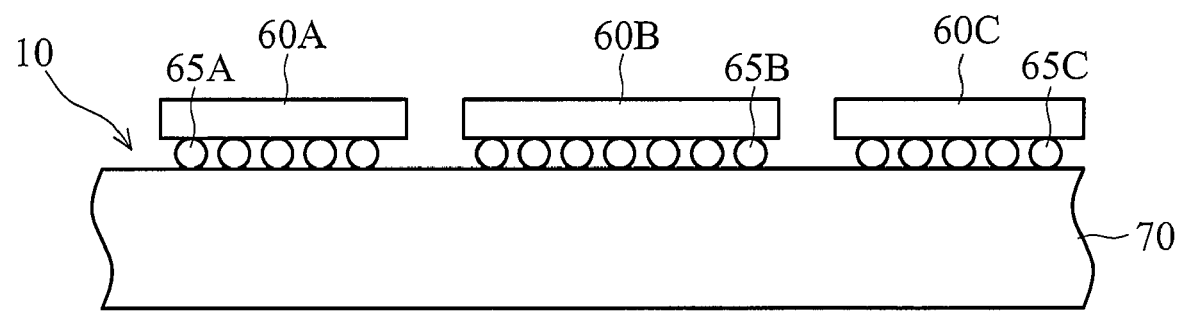
FIG. 11 shows an application schematic diagram of an ESD protection structure according to another embodiment of the invention.

FIG. 11 shows an application schematic diagram of an ESD protection structure according to another embodiment of the invention. In this embodiment, a substrate 70 is a PCB. In addition, the electrical devices 60A, 60B and 60C are active or passive devices, such as the functional dies, capacitors, inductors or resistors. The electrical devices 60A, 60B and 60C are coupled to the vias of the PCB 70 through the connecting points 65A, 65B and 65C disposed on the surface 10, respectively. Therefore, the PCB 70 is electrically connected to the pins of the electrical devices 60A, 60B and 60C through the connecting points 65A, 65B and 65C.

As described above, the ESD protection structures described in the embodiments of the invention can be implemented on the surface or interior of the substrate carried by the electrical device, which is disposed on the surface or interior of the PCB 70. Moreover, according to the ESD protection structures described in the invention, if an ESD event occurs, for ESD event occurrence, the energy generated from the ESD event will be applied to the ESD protection structures of the substrate or PCB with a scaled or un-scaled manner respectively, by adjusting some specific configurations of the substrate or PCB (such as VVM thickness, VVM layer number, electrical configuration size etc.) to share the energy collectively, thus enhancing the ESD protection capability of electrical devices or systems ($V_{ESD}$).

Figure 12A:
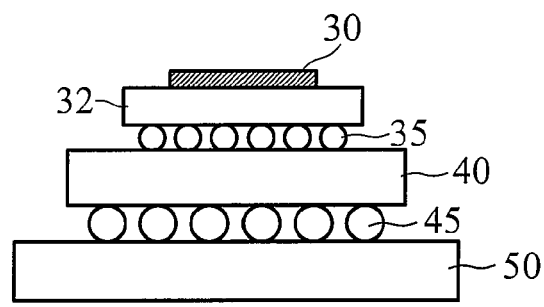
FIGS. 12A, 12B and 12C show the application schematic diagrams of an ESD protection structure according to another embodiment of the invention, respectively.
Figure 12B:
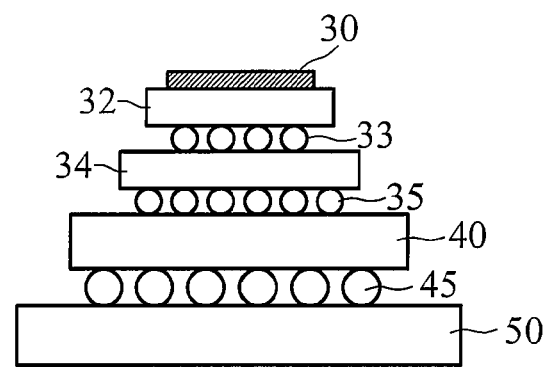
Figure 12C:
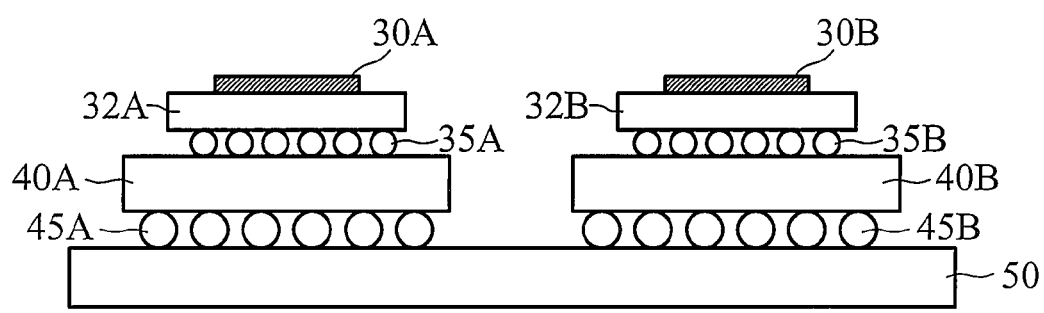

FIGS. 12A, 12B and 12C show the application schematic diagrams of an ESD protection structure according to another embodiment of the invention, respectively. In FIG. 12A, a functional die 30 is disposed on an interposer 32 and is electrically connected to an IC package substrate 40 through the connecting points 35, and the IC package substrate 40 is electrically connected to a PCB 50 through the connecting points 45. In FIG. 12B, the functional die 30 is disposed on the interposer 32 and is electrically connected to an interposer 34 through the connecting points 33. The interposer 34 is electrically connected to the IC package substrate 40 through the connecting points 35, and the IC package substrate 40 is electrically connected to the PCB 50 through the connecting points 45. In FIG. 12C, a functional die 30A is disposed on an interposer 32A and is electrically connected to an IC package substrate 40A through the connecting points 35A, and a functional die 30B is disposed on an interposer 32B and is electrically connected to an IC package substrate 40B through the connecting points 35B. The IC package substrates 40A and 40B are electrically connected to the PCB 50 through the connecting points 45A and 45B, respectively. In FIGS. 12A, 12B and 12C, the ESD protection structures of the invention can apply to the interposer, IC package substrate, PCB or combination thereof.

Figure 13A:
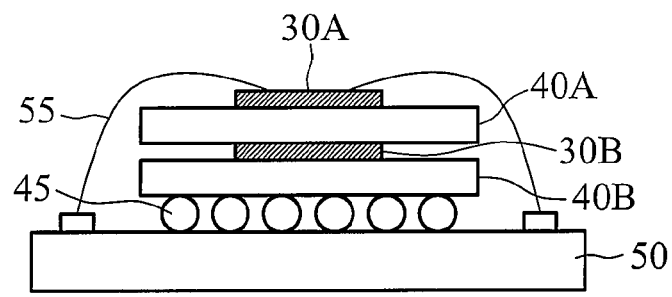
FIGS. 13A, 13B and 13C show the stacking application schematic diagrams of an ESD protection structure according to another embodiment of the invention, respectively.
Figure 13B:
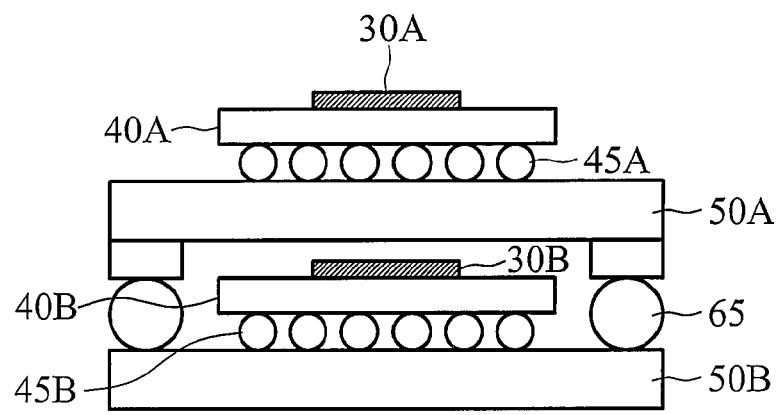
Figure 13C:
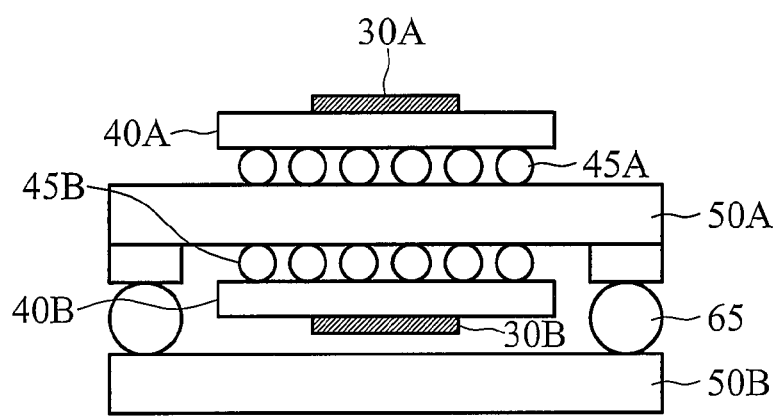

FIGS. 13A, 13B and 13C show the stacking application schematic diagrams of an ESD protection structure according to another embodiment of the invention, respectively. In FIG. 13A, the functional die 30A is electrically connected to the functional die 30B through the IC package substrate 40A. In another embodiment, a connecting relation between the IC package substrate 40A and the functional die 30B is only a mechanical structure without electrically connection efficiency, wherein the functional die 30B is disposed in the IC package substrate 40B and is electrically connected to the PCB 50 through the connecting points 45. Furthermore, the functional die 30A is also electrically connected to the PCB 50 through the wire bond 55. In another embodiment, the functional die 30A is electrically connected to the PCB 50 through the IC package substrate 40B and the functional die 30B electrically connected to the IC package substrate 40A. In FIG. 13B, the functional die 30A is disposed in the package 40A and is electrically connected to the PCB 50A through the connecting points 45A, and the functional die 30B is disposed in the IC package substrate 40B and is electrically connected to the PCB 50B through the connecting points 45B. In addition, the PCB 50A is electrically connected to the PCB 50B through the connecting points 65. In this embodiment, the PCBs 50A and 50B may also be the IC package substrates which are electrically connected to other PCBs (not shown) through the connecting points (not shown). In FIG. 13C, the functional die 30A is disposed in the IC package substrate 40A and is electrically connected to the PCB 50A through the connecting points 45A, and the functional die 30B is disposed in the IC package substrate 40B and is electrically connected to the PCB 50A through the connecting points 45B. In addition, the PCB 50A is electrically connected to the PCB 50B through the connecting points 65. In this embodiment, the PCBs 50A and 50B may also be the IC package substrates which are electrically connected to other PCBs (not shown) through the connecting points (not shown). In FIGS. 13A, 13B and 13C, the ESD protection structures of the invention can apply to the interposer, IC package substrate, PCB or combination thereof within the stacking structure.

The substrates provided by the invention are formed by IC package substrate/PCB manufacturing technologies, such as thick film or thin film. Moreover, the substrates provided by the invention can also apply to organic or inorganic substrates.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An electrostatic discharge (ESD) protection structure, comprising:
    a substrate comprising a first voltage variable material and having a first surface, a second surface substantially paralleled to the first surface and a via connecting the first and second surfaces; and
    a first metal layer disposed in the substrate for coupling to a ground terminal,
    wherein the first voltage variable material is in a conductive state when an ESD event occurs, such that the via is electrically connected with the first metal layer to form a discharge path, and the first voltage variable material is in an isolation state when the ESD event is absent, such that the via is electrically isolated from the first metal layer;
    wherein the substrate further comprises at least a first insulation dielectric material without the voltage variable material characteristics, and the first insulation dielectric material is adjacent to the first voltage variable material.

2. The ESD protection structure as claimed in claim 1, wherein the substrate further comprises at least a second voltage variable material, and the first and second voltage variable materials have different dielectric constants.

3. The ESD protection structure as claimed in claim 1, wherein the first metal layer further comprises a first point part, and the first point part is pointed to the via.

4. The ESD protection structure as claimed in claim 3, wherein the via further comprises a second point part, and the second point part is parallel to the first surface and is pointed to the first point part.

5. The ESD protection structure as claimed in claim 1, wherein the via further comprises a second point part, and the second point part is parallel to the first surface and is pointed to the first metal layer.

6. The ESD protection structure as claimed in claim 1, further comprising a second metal layer which is disposed in the substrate and is adjacent to and electrically connected with the via, wherein the first and second metal layers have an overlap part in a projection direction.

7. The ESD protection structure as claimed in claim 1, wherein the substrate is used to carry and couple to the electrical devices or printed circuit boards.

8. The ESD protection structure as claimed in claim 7, wherein the substrate is one of an interposer, an IC package substrate and a printed circuit board.

9. An electrostatic discharge (ESD) protection structure, comprising:
    a substrate having a first surface, a second surface substantially paralleled to the first surface and a via connecting the first and second surfaces;
    a first metal layer disposed in the substrate for coupling to a ground terminal,
    a voltage variable material layer disposed in the substrate and adjacent to the via and the first metal layer, comprising a first voltage variable material,
    wherein the voltage variable material layer is in a conductive state when an ESD event occurs, such that the via is electrically connected with the first metal layer to form a discharge path, and the voltage variable material layer is in an isolation state when the ESD is absent, such that the via is electrically isolated from the first metal layer;
    wherein the substrate further comprises at least a first insulation dielectric material without the voltage variable material characteristics, and the first insulation dielectric material is adjacent to the first voltage variable material.

10. The ESD protection structure as claimed in claim 9, wherein the substrate further comprises at least a second voltage variable material, and the first and second voltage variable materials have different dielectric constants.

11. The ESD protection structure as claimed in claim 9, wherein the first metal layer further comprises a first point part, and the first point part is pointed to the via.

12. The ESD protection structure as claimed in claim 11, wherein the via further comprises a second point part, and the second point part is parallel to the first surface and is pointed to the first point part.

13. The ESD protection structure as claimed in claim 9, wherein the via further comprises a second point part, and the second point part is parallel to the first surface and is pointed to the first metal layer.

14. The ESD protection structure as claimed in claim 9, further comprising a second metal layer which is disposed in the substrate and is adjacent to and electrically connected with the via, wherein the voltage variable material layer is disposed between the first and second metal layers, and the first and second metal layers have an overlap part in a projection direction.

15. The ESD protection structure as claimed in claim 9, wherein the substrate is used to carry and couple to the electrical devices or printed circuit boards.

16. The ESD protection structure as claimed in claim 15, wherein the substrate is one of an interposer, an IC package substrate and a printed circuit board.

17. The ESD protection structure as claimed in claim 1, wherein the first metal layer is disposed on the first surface of the substrate, the first voltage variable material is adjacent to the first surface of the substrate, and the second voltage variable material is adjacent to the second surface of the substrate.

18. The ESD protection structure as claimed in claim 1, wherein the first metal layer is disposed on the second surface of the substrate, the first voltage variable material is adjacent to the second surface of the substrate, and the second voltage variable material is adjacent to the first surface of the substrate.

19. The ESD protection structure as claimed in claim 1, wherein the first metal layer is disposed within the substrate and is surrounded by the first voltage variable material, which is surrounded by the second voltage variable material.

20. The ESD protection structure as claimed in claim 1, wherein the first metal layer is disposed within the substrate and is surrounded by the second voltage variable material; wherein the first voltage variable material is disposed between the first metal layer and the via, and has substantially the same thickness as the first metal layer.

21. The ESD protection structure as claimed in claim 20, further comprises a signal layer disposed on at lest on of the first surface and the second surface of the substrate, a ring disposed on at lest on of the first surface and the second surface of the substrate connects the signal layer and the via, and a power layer disposed in the second voltage variable material.

22. The ESD protection structure as claimed in claim 4, further comprising a second metal layer which is disposed in the substrate and is adjacent to and electrically connected with the via, wherein the first and second metal layers have an overlap part in a projection direction.

23. The ESD protection structure as claimed in claim 9, wherein the first metal layer is disposed on the first surface of the substrate, the first voltage variable material is adjacent to the first surface of the substrate, and the second voltage variable material is adjacent to the second surface of the substrate.

24. The ESD protection structure as claimed in claim 9, wherein the first metal layer is disposed on the second surface of the substrate, the first voltage variable material is adjacent to the second surface of the substrate, and the second voltage variable material is adjacent to the first surface of the substrate.

25. The ESD protection structure as claimed in claim 9, wherein the first metal layer is disposed within the substrate and is surrounded by the first voltage variable material, which is surrounded by the second voltage variable material.

26. The ESD protection structure as claimed in claim 9, wherein the first metal layer is disposed within the substrate and is surrounded by the second voltage variable material; wherein the first voltage variable material is disposed between the first metal layer and the via, and has substantially the same thickness as the first metal layer.

27. The ESD protection structure as claimed in claim 26, further comprises a signal layer disposed on at lest on of the first surface and the second surface of the substrate, a ring disposed on at lest on of the first surface and the second surface of the substrate connects the signal layer and the via, and a power layer disposed in the second voltage variable material.

28. The ESD protection structure as claimed in claim 12, further comprising a second metal layer which is disposed in the substrate and is adjacent to and electrically connected with the via, wherein the first and second metal layers have an overlap part in a projection direction.

* * * * *